(12) United States Patent
Lamy et al.

(10) Patent No.: US 6,891,484 B2
(45) Date of Patent: May 10, 2005

(54) METHOD OF DECODING A VARIABLE-LENGTH CODEWORD SEQUENCE

(75) Inventors: Catherine Lamy, Paris (FR); Olivier Pothier, Paris (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/477,889

(22) PCT Filed: May 21, 2002

(86) PCT No.: PCT/IB02/01878
§ 371 (c)(1),
(2), (4) Date: Nov. 19, 2003

(87) PCT Pub. No.: WO02/095955
PCT Pub. Date: Nov. 28, 2002

(65) Prior Publication Data
US 2004/0155802 A1 Aug. 12, 2004

(30) Foreign Application Priority Data
May 22, 2001 (EP) .......................... 01401349

(51) Int. Cl.⁷ .......................... H03M 13/41
(52) U.S. Cl. .......................... 341/67; 375/265; 714/794
(58) Field of Search .................. 341/65, 67; 375/265, 375/290; 714/792, 794, 795, 796

(56) References Cited

U.S. PATENT DOCUMENTS 5,446,758 A * 8/1995 Eyuboglu .................. 375/259
5,588,028 A * 12/1996 Parizhsky .................. 375/341
6,151,370 A * 11/2000 Wei .......................... 375/341
6,233,290 B1 * 5/2001 Raphaeli .................... 375/341
6,246,347 B1 * 6/2001 Bakhmutsky ............... 341/67
6,442,212 B1 * 8/2002 Kratochwil ................ 375/265

OTHER PUBLICATIONS

Park et al., Joint Source–Channel Decoding for Variable–Length Encoded Data by Exact and Approximate MAP Sequence Estimation, Jan. 2000, IEEE Transactions on Communications, vol. 48 No. 1, pp. 1–6.*

Sayood et al., Joint source/channel coding for variable length codes, IEEE Transactions on Communications, May 2000, vol.: 48, Issue: 5, pp. 787–794.*

"Joint Source–Channel Decoding for Variable–length Encoded Data . . . " IEEE Conf. on Acoustics, SPeech and Signal Processing ICASSP '99 p. 2451–2454 Mar. 15–19, 1999 Park & Miller.

* cited by examiner

Primary Examiner—Howard L. Williams

(57) ABSTRACT

The present invention relates to a method of source decoding variable-length codeword sequences, said decoding being based on an associated state diagram comprising a plurality of states (S) and on a code (C). It is characterized in that it comprises a step of reducing the states (S) in the state diagram in such a way that, at a bit time (Bj), only a number N of states in a group (G) of states is saved on the basis of a criterion derived from a partial metric computation and otherwise independently of an alphabet of said code (C), a group (G) being associated with a bit time (Bj). A group (G) corresponds to all the states (S) calculated at each bit time (Bj).

21 Claims, 8 Drawing Sheets

METHOD OF DECODING A VARIABLE-LENGTH CODEWORD SEQUENCE

The present invention relates to a method of source decoding variable-length codeword sequences, said source decoding being based on an associated state diagram comprising a plurality of states and on a code, a state being a node in the graph through which possible decoded codeword sequences may pass. The invention also relates to a decoder, said decoder utilizing said method.

Such a method may be used in any system using variable-length codes like, for example, a video or audio communication system.

Figure 1:
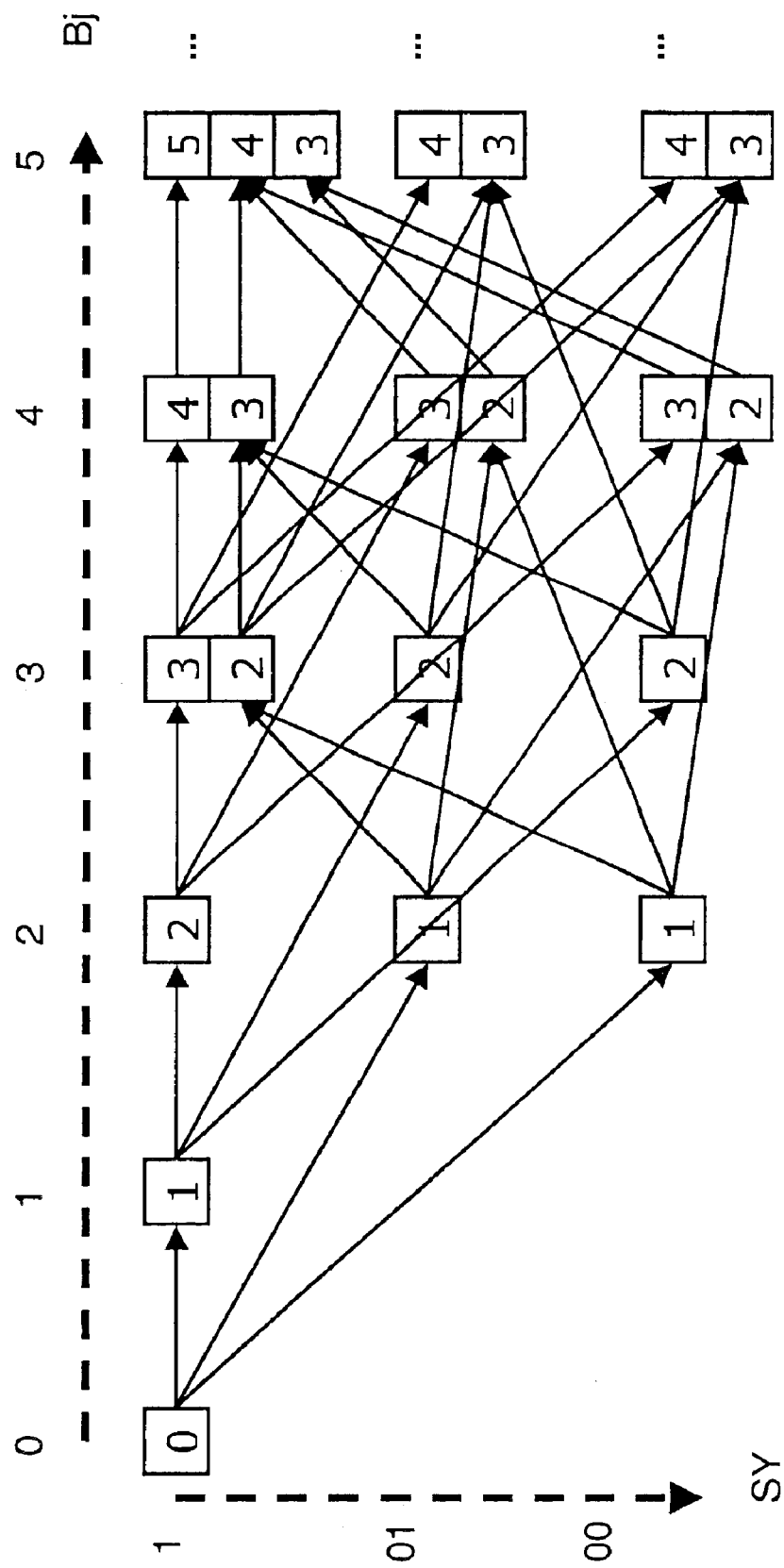

A video communication system typically comprises a source encoding system, a channel and a source decoding system. Said source encoding system generates a codeword sequence and transmits it through said channel to said source decoding system that decodes it by virtue of a shared code. Said shared code defines a plurality of symbols. A codeword sequence comprises a plurality of symbols. The decoding is made through a state diagram (classically known as bit directed graph) as shown in FIG. 1.

The state diagram comprises an X-axis that represents bit times, and an Y-axis that represents an alphabet of the shared code, which comprises a set of values. In FIG. 1, the alphabet comprises three values "1", "01", "00". A box represents a state of the state diagram. A path is represented by transitions between different states and a decoded sequence is represented by a path and a beginning state (generally state 0) and an ending state.

As there are some perturbations through the channel, the received codeword sequence contains errors; hence, there is a plurality of possible decoded codeword sequences. Said state diagram gives the possible decoded codeword sequences, a state being a node in the graph through which the possible decoded codeword sequences may pass. One optimal method is to look for the whole possible decoded codeword sequences by virtue of the code, independently of the received sequence, and to select the best decoded codeword sequence at the end of the state diagram construction. A solution to find the best complete decoded codeword sequence is then to search among these sequences for the one that has the smallest distance (in accordance with a chosen metric) from the received sequence.

One major problem of this solution is that the graph is more complex as the sent codeword sequence is longer, the more complex the graph is, and the more the number of decoded codeword sequences to look for increases. Therefore, as described in "Joint source-channel decoding for variable length encoded data by exact and approximate map sequence estimation", Proceedings of the IEEE Conference on Acoustics, Speech and Signal Processing referenced ICASSP'99 pp. 2451–2454, Mar. 15–19, 1999 written by Park and Miller, a proposed solution to this complexity problem is to reduce the number of states by selecting, at each bit time, the decoded codeword sequence which has the best metric among a set of the states which have the same symbol value within the alphabet of the shared code. However, this solution does not yield a satisfactory packet error rate performance.

Accordingly, it is an object of the invention to provide a method and a decoder for source decoding variable-length codeword sequences, said source decoding being based on an associated state diagram comprising a plurality of states and on a code, a state being a node in the graph through which possible decoded codeword sequences may pass, which achieves an efficient decoding with a reasonable complexity.

To this end, the method according to the invention comprises a step of reducing the states in the state diagram in such a way that, at a bit time, only a number N of states in a group of states is saved on the basis of a criterion derived from a partial metric computation and otherwise independently of an alphabet of said code, a group being associated with a bit time.

In addition, the decoder according to the invention comprises states reduction means adapted to save, at a bit time, only a number N of states in a group of states on the basis of a criterion derived from a partial metric computation and otherwise independently of an alphabet of said code, a group being associated with a bit time.

As will be seen in detail below, such a method allows, on the one hand, a reduction of the states in the state diagram at each step of the diagram construction and, on the other hand, a better performance thanks to the criterion derived from the partial metric computation.

In a first embodiment, the method of source decoding is characterized in that the criterion is such that only one state S is saved among all the states of a group G which have the same number of symbols SY, in accordance with a best metric condition.

As will be seen below, the number of states N is upper-bounded by the bit time, hence the complexity is limited by such an upper bound. Therefore, such a criterion leads to performances similar to the optimal method of the prior art with less complexity.

In a second embodiment, the method of source decoding is characterized in that the criterion is such that the saved states have the best metrics in said group of states.

As will be apparent hereinafter, the number of states N is fixed in this case. Therefore, such a criterion leads to a state diagram whose complexity is stable and does not increase with the bit time, contrary to the optimal case, and such a criterion leads to a state diagram that does not depend anymore on the length of the sent codeword sequence. Moreover, it gives a good Packet Error rate performance contrary to the Park & Miller method of the prior art.

Figure 2:
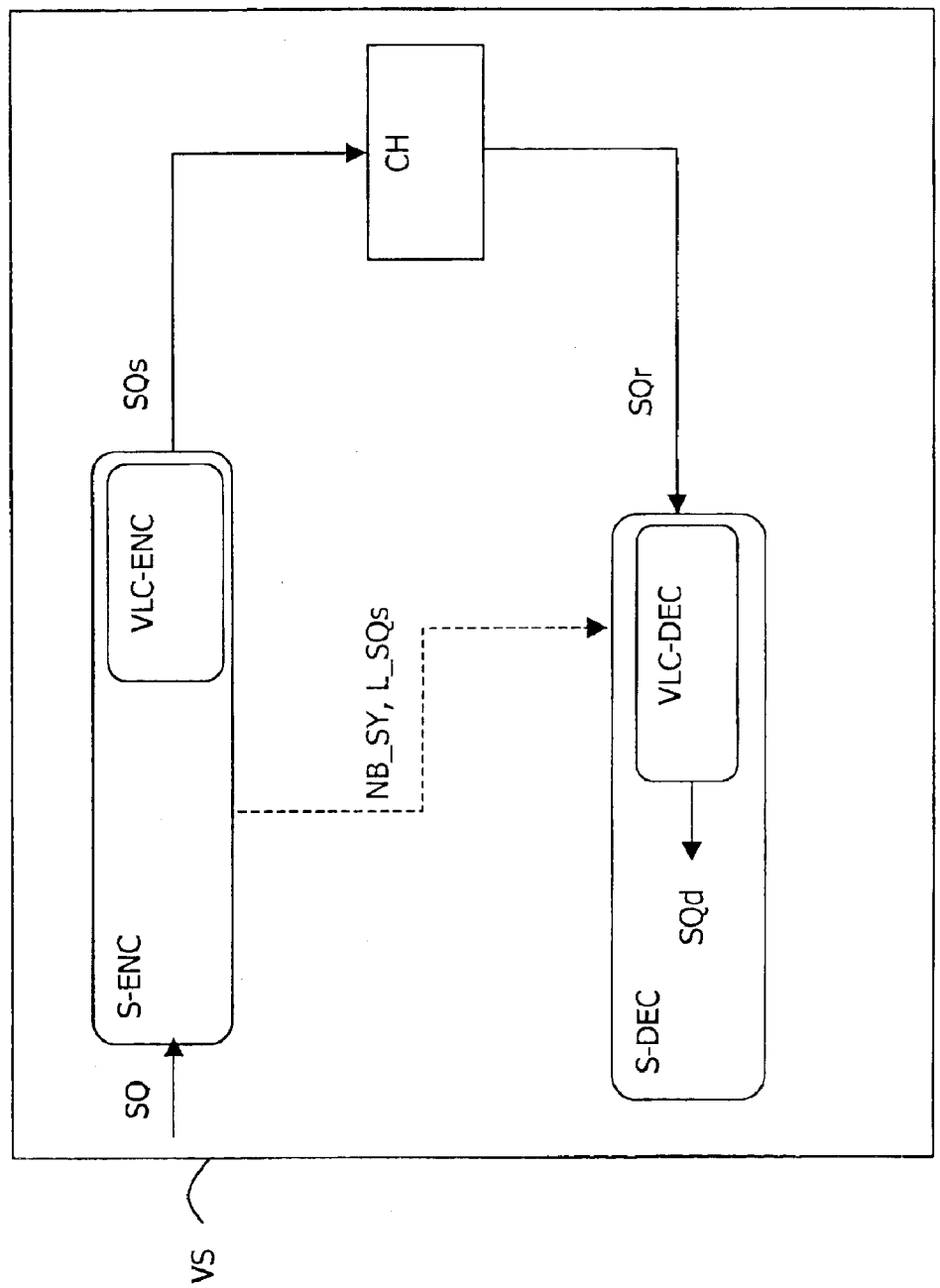
Figure 3:
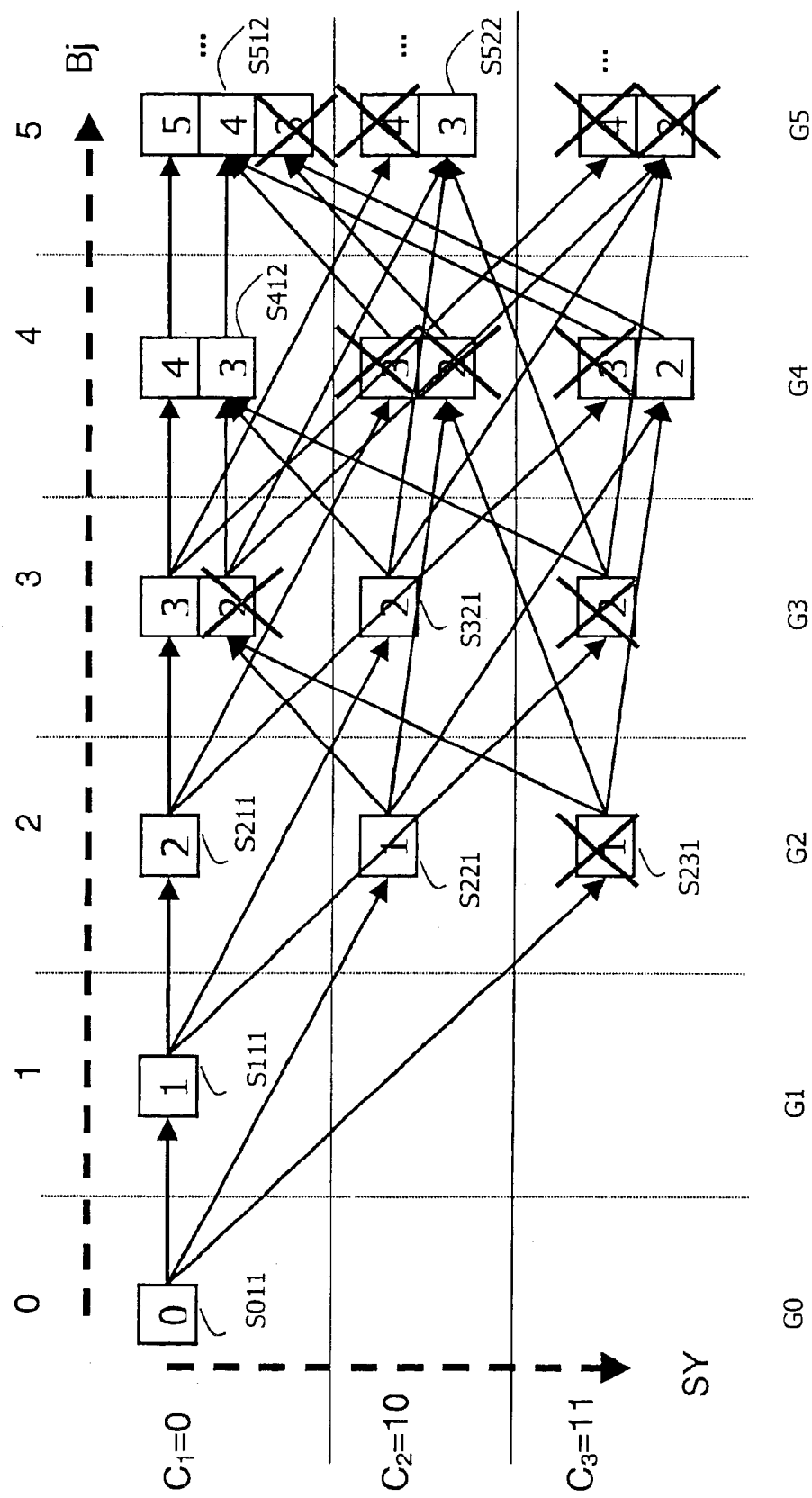
Figure 4:
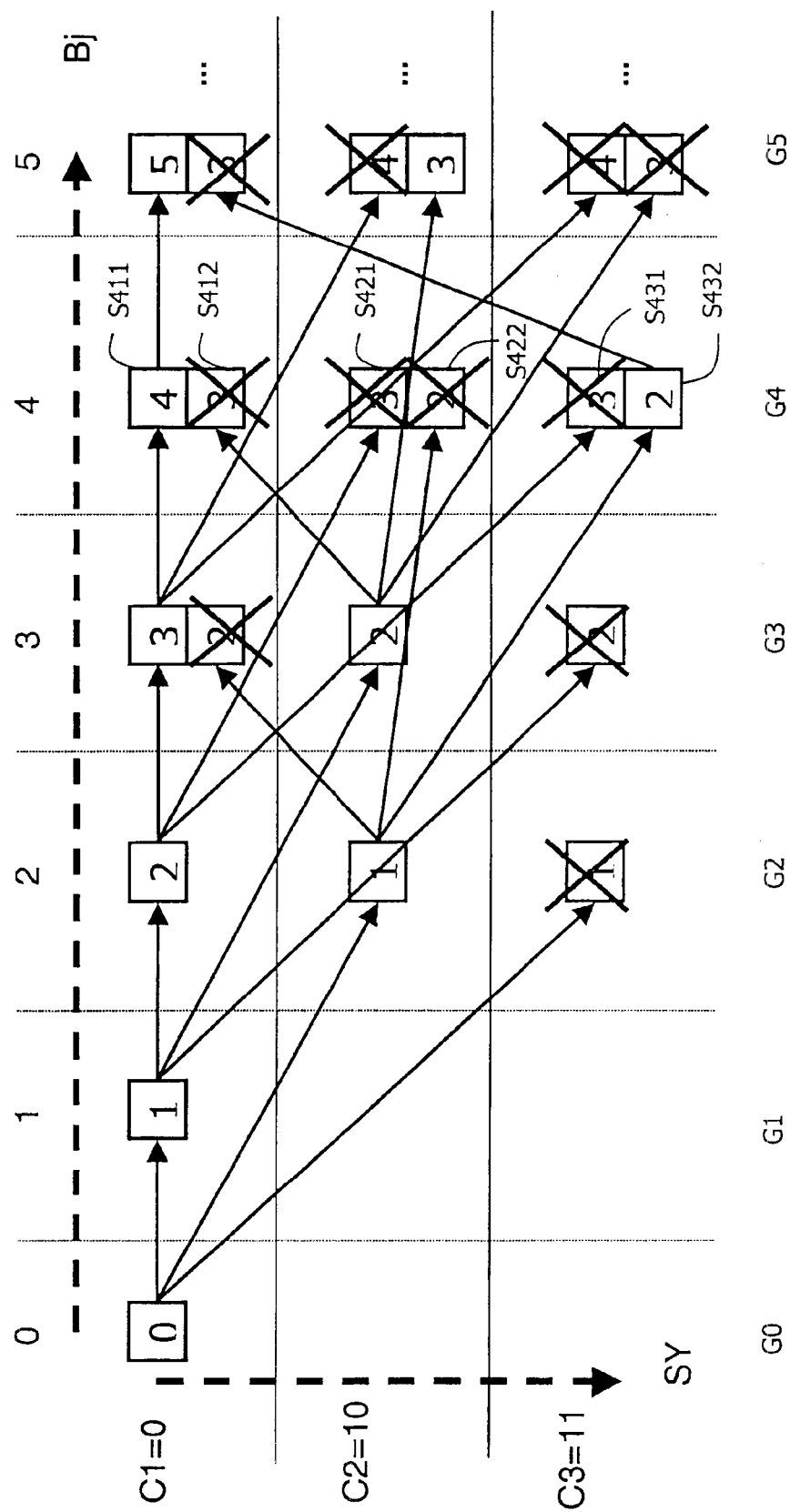
Figure 5:
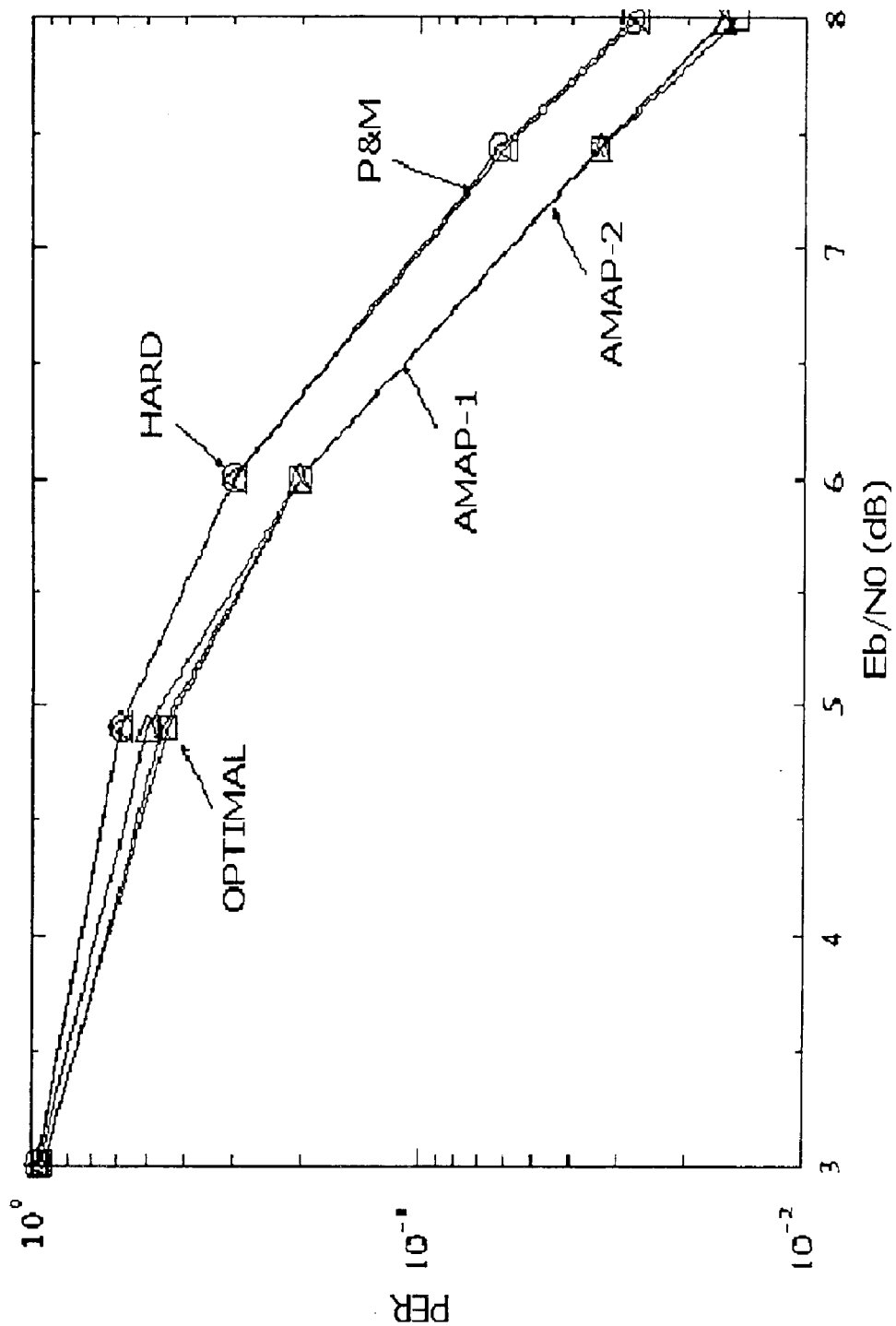
Figure 6:
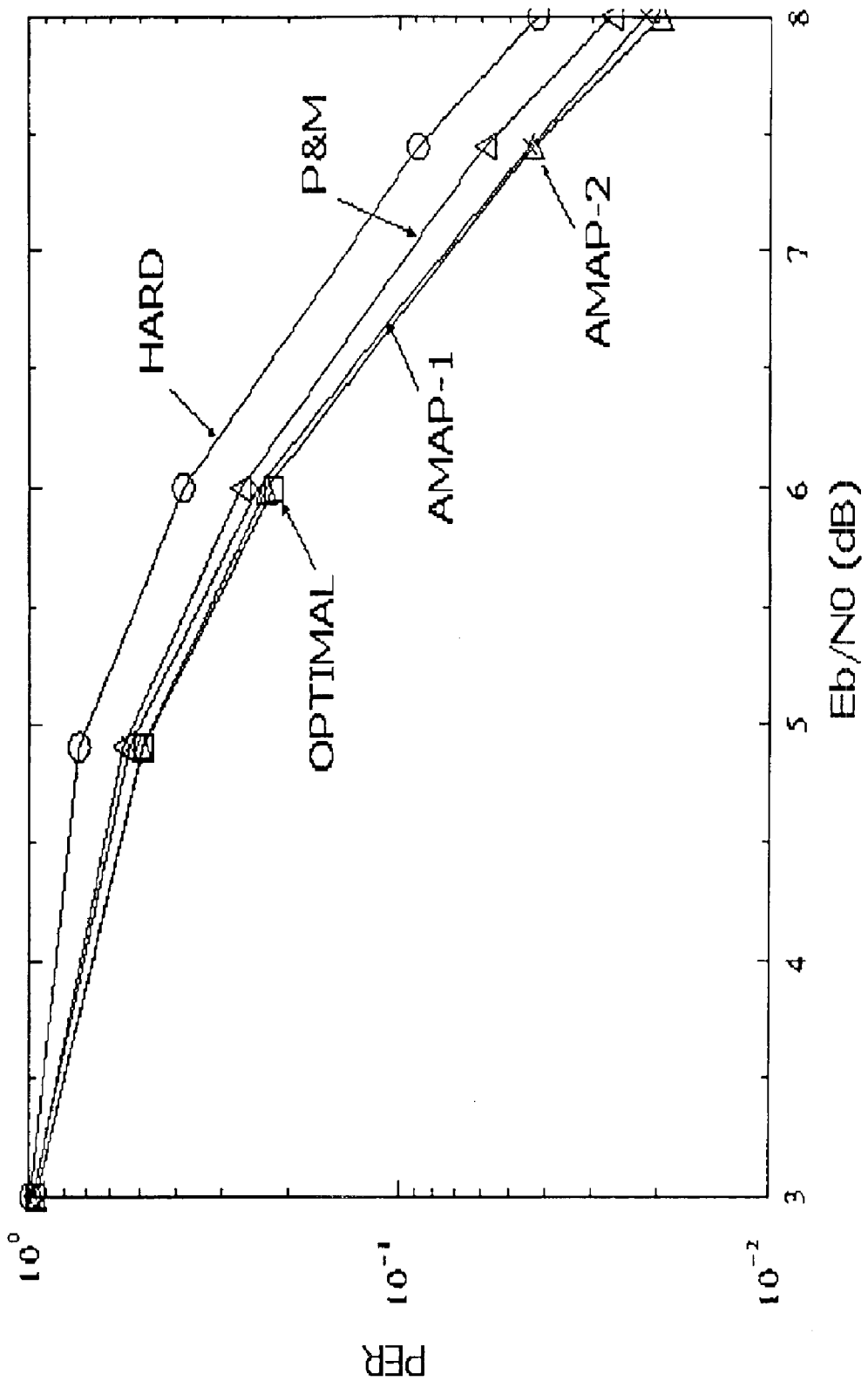
Figure 7:
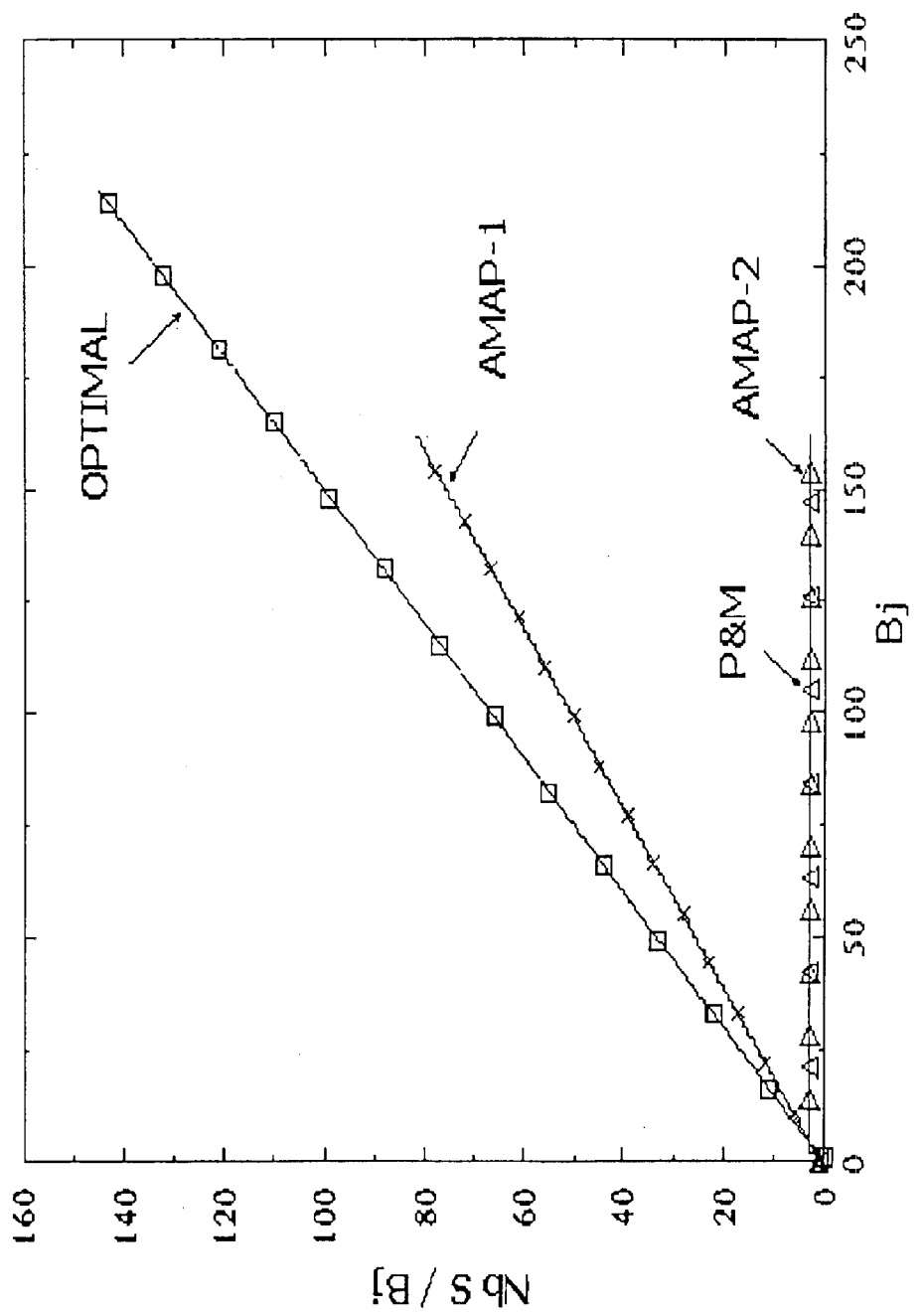

Additional objects, features and advantages of the invention will become apparent upon reading the following detailed description with reference to the accompanying drawings in which:

FIG. 1 illustrates a state diagram of a method of source decoding of variable-length codeword sequences according to the prior art, FIG. 2 is a schematic diagram of a video communication system wherein the method of source decoding according to the invention is used, FIG. 3 is a first state diagram of a method of source decoding of variable-length codeword sequences according to a first embodiment of the invention, FIG. 4 is a second state diagram of a method of source decoding of variable-length codeword sequences according to a second embodiment of the invention, FIG. 5 is a first graph showing first performance of the method according to the invention, illustrated in FIG. 3 and FIG. 4, FIG. 6 is a second graph showing second performance of the method according to the invention, illustrated in FIG. 3 and FIG. 4, and FIG. 7 is a third graph showing complexity results of the method according to the invention, illustrated in FIG. 3 and FIG. 4.

Figure 8:
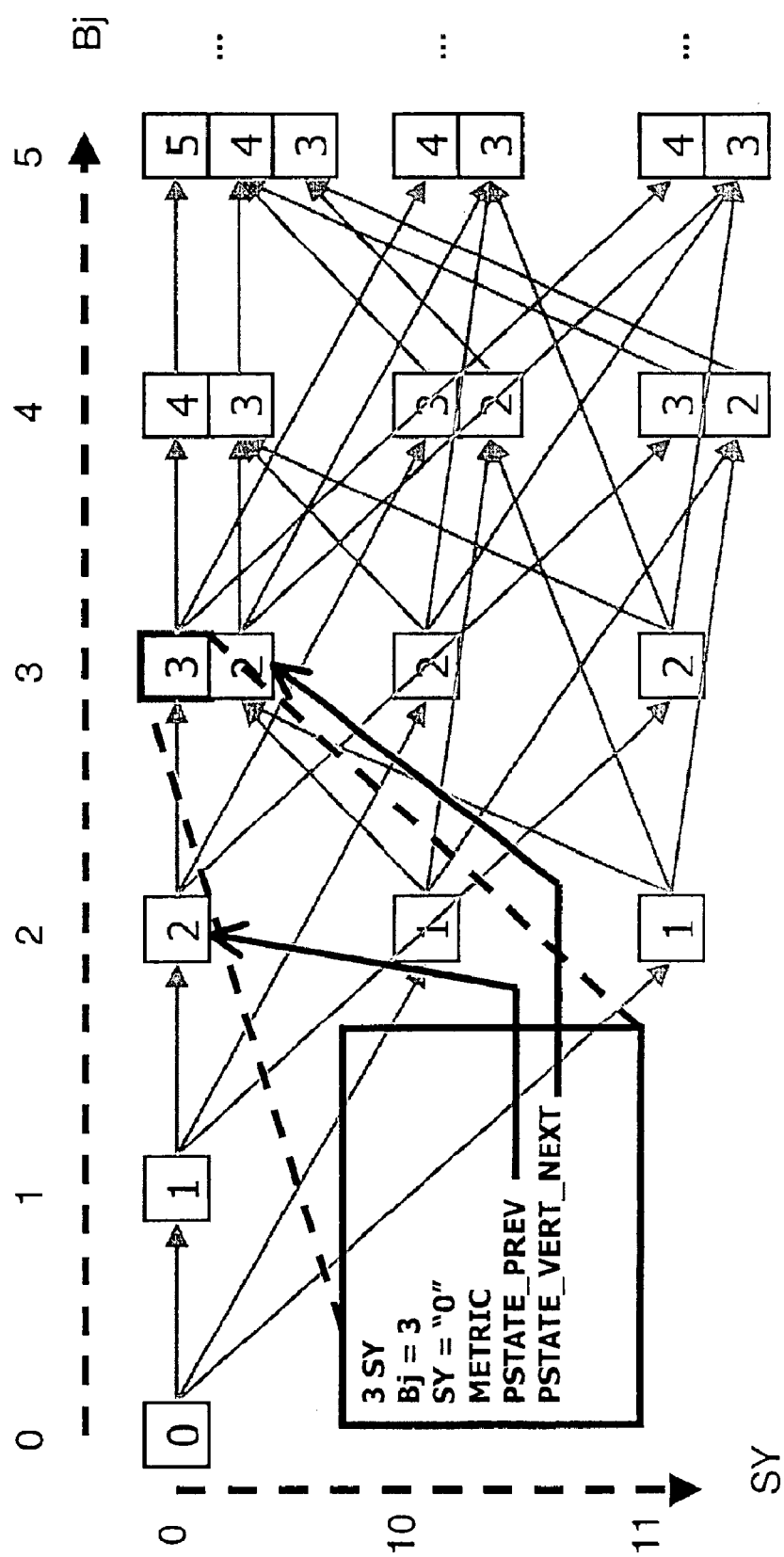

FIG. 8 is a third state diagram showing one implementation of the method according to the invention, illustrated in FIG. 3 and FIG. 4.

In the following description, well-known functions or constructions by a person skilled in the art are not described in detail since they would obscure the invention in unnecessary detail.

The present invention relates to a method of source decoding variable-length codeword sequences based on an associated state diagram comprising a plurality of states. Said method is used in particular in a Variable-Length-Code decoder called VLC decoder as shown in FIG. 2 within a video communication system VS. Besides, said video communication system VS comprises a source encoding system S-ENC comprising a VLC encoder VLC-ENC, a channel CH and a source decoding system S-DEC comprising said VLC decoder. The source encoding system S-ENC encodes a codeword sequence SQ via the VLC encoder and transmits it through said channel CH during a plurality of bit times to said source decoding system S-DEC which decodes it via the VLC decoder VLC-DEC by virtue of a shared code C. The transmission is made bit by bit. A codeword sequence SQ has a variable length L_SQ. This means that the sent codeword sequences SQs may have different lengths, hence, the received codeword sequences SQr may have different lengths. A codeword sequence SQ comprises a plurality of symbols SY that are defined through the shared code C. Note that one symbol SY comprises at least one bit.

In a first example shown in FIG. 3, the code C is defined as follows.

a maximum Length L_MAX which is equal to 2 and also represents the maximum length of a symbol=2, a size K which is equal to 3 and also represents the number of symbols, an alphabet of the code C which comprises a set of values $[C_1, C_2, C_3]$ which are equal to [0;10;11] and also represent the values which can be taken by the 3 symbols. 3 probabilities $[Pc_1, Pc_2, Pc_3]$ of appearance are associated with these code values.

A sent codeword sequence is defined as follows. For instance, SQs'=0 0 1 1 0 1 0 0. Then, after a step of modulation in the source encoding system S-ENC, for instance a BPSK modulation step which is well known to those skilled in the art, SQs=−1; −1; 1; 1; −1; 1; −1; −1. Then, because of perturbations of the channel CH, the sequence SQr received by the source decoding system is SQr=−0,8; −0,7; 0.2; 1.2; −0.5; 0.6; −0.3; 0.3.

From now on, the received sequence SQr must be decoded to recover the sent sequence SQs. In other words, we have to recover the symbols SY that have been sent in said sent sequence SQs. Because of the perturbations, which lead to errors, we notice that there may be many possible decoded codeword sequences SQd.

A state diagram is used to show all the possible decoded codeword sequences SQd. FIG. 3 illustrates such a state diagram. The X-axis represents the bit times. The Y-axis represents an alphabet of the code C used, the alphabet comprising a set of values which also represent values that may be taken by the symbols SY.

The state diagram of FIG. 3 comprises 6 groups of states G0 to G5, each being associated with the bit times B0 to B5 respectively. A group G corresponds to all the states calculated at each bit time Bj (j≧0) when a codeword sequence SQr is received, whatever the alphabet of the code C. A box in the state diagram represents a state S. A number T of symbols is indicated in each state box. It represents the number of symbols SY within a partial received sequence SQr at a certain bit time Bj. It also represents the number of symbols within a corresponding possible decoded codeword sequence SQd.

Whereas vertical lines delimit the groups of states, horizontal lines delimit the alphabet of the code C comprising three values $C_1, C_2, C_3$ that may be taken by the symbols.

A path represents a decoded codeword sequence SQd. It is composed of an ending state and intermediate states. For example, the path S011–S111–S321–S412–S512 is composed of the ending state S512 and three intermediate states S111, S321 and S412 to which the symbols "0", "10","0" and "0", respectively, correspond. The total number of symbols is equal to 4.

Note that we represent a state S with indexes Sklm with k=number of the group, l=number of the values within the alphabet of the code C, and m=order of the state in the group and the code value. For example, S211 means that this state S belongs to the group G2, to the code value C1 and is the first state in this group G2 for the code value C1.

As can be seen from the state diagram, a state may be the ending state or an intermediate state of different paths, therefore, we can say that such a state S at a bit time Bj represents a node in the graph through which possible decoded codewords sequences may pass, which are also called decoded symbol sequences.

In order to select the best decoded codeword sequence SQd that best matches the sent codeword sequence SQs, a first step 1) of reducing the states in the state diagram is performed. At a bit time Bj (j≧0), only a number N of states in a group G of states is saved in relation to a criterion based on a partial metric computation and otherwise independently of the alphabet of said code C, a group G being associated with a bit time Bj.

As will be further explained, the number N of states is either upper-bounded by the bit time in a first embodiment, or equal to a given value NBMAX in a second embodiment.

Thus, the reduction step comprises two sub-steps. In a first sub-step A), computations of partial metrics on partial sequences are performed. The adjective "partial" means that a computation of a metric is performed before the end of the reception of the whole sequence SQr. The metric computation is performed in accordance with a "Maximum A Posteriori" criterion called MAP criterion, which, as known to those skilled in the art, is equivalent to the computation of a Euclidean distance between a partial received sequence SQr and the partial sent sequence SQd after modulation, followed by weighting by a factor depending on the codeword probabilities of appearance.

The formula for the whole metric computation is:

$m(i) = \Sigma_i (\|SQr_i - Ci\|^2 + \ln(P_{Ci}))$, where $SQr_i$ is a part of the sent sequence SQr corresponding to the emission of the code Ci. A partial metric can be easily deduced from this as being composed of only the first terms of the sum.

As can be seen, the construction of the state diagram is effected as a function of the received sequence SQr, contrary to the optimal method as stated in the prior art. Indeed, at each bit time, there are some states which are removed on the basis of partial metric computations which depend on partial received sequences, whereas in the prior art, no states are removed and whole metric computations are performed at the end of the state diagram construction, or the state removal techniques are not close enough to the optimum.

In a second sub-step B), the reduction criterion is applied.

In a first embodiment, as shown in FIG. 3, the criterion is such that only one state is saved among all the states of a group G which have the same number T of symbols SY, in accordance with a best metric condition.

A metric associated with a considered state S is one of the partial metrics computed in the first sub-step A) of a partial sequence which goes up to said considered state S.

Thus, in FIG. 3, for example, at bit time=2, we look for the state S which has the best metric among all the states of the third group G2 which have T=1 symbol SY. The second state S221 and the third state S231 in the third group G2 have T=1 symbol SY. The second state S221 is saved because it has a better metric than the third state S231. For the number of symbols T=2, there is only one state S211, said state is kept. We do the same for bit time=3 and number of symbols T=2, and so on.

One advantage of this first embodiment is that the complexity of the state diagram is now easily bounded: the bit time value is in fact an obvious majoration of the number N of states. However, as said number N of states is not fixed, it still depends on the length of the sent codeword sequence SQs. Therefore, the complexity will still increase with the bit time.

In a second preferred embodiment, as shown in FIG. 4, the criterion is such that the saved states S have the best metric, no matter the symbol or bit value, or the number of symbols or bits. The number N of the saved states is defined as being a given value NBMAX and is taken as a function of the performance we want to achieve and the complexity we want to have. No more conditions are used. Thus, for example, the number of states to save is NBMAX=2. In FIG. 4, at bit time=4, the first and sixth states S411 and S432 are saved because they have the best metrics. The other states are removed. Note that all the states S with the same number of symbols SY, here with the number 3, can be removed.

The advantages of the second embodiment compared to the prior art are:
  NBMAX can be fixed as we want,
  as NBMAX is invariant, the complexity does not increase with the bit time or consequently with the length of the sent codeword sequence SQs, contrary to the optimal method or Park & Miller method of the prior art.

Note that for the two embodiments, when a state S is removed, it implies that the branches that would have come from it are no longer considered as likely candidates. The reduction of the state diagram is clearly noticeable, as the number of surviving states in the state diagram at bit time Bj (i.e. for a partial sequence of j bits) is at most equal to j for the first embodiment, and at most equal to NBMAX for the second embodiment. Moreover, as mentioned before, it clearly appears that the complexity of this last state diagram does not depend anymore on the length of the sent codeword sequence SQs.

Note also that apart from its influence in the metric derivation, the reduction step is performed independently of the code C alphabet or elements' probability of appearance, contrary to the Park & Miller method.

At the end of the diagram construction, when there are no more bits sent within a codeword sequence, a final decision, which is the same for both embodiments, is taken. It consists of a second step 2) of selecting a final best state Sf, among the saved states, as being the state with the best metric, and of determining the best decoded codeword sequence SQd which has the same number of symbols SY as the sent codeword sequence SQs.

Note that it is supposed that, on the one hand, the VLC decoder knows the number of symbols NB_SY sent by the VLC encoder within a sent sequence SQs, and, on the other hand, the length L_SQs in bits of said sent sequence SQs for the end of the diagram construction.

Note also that, as classically found in the literature and well known to those skilled in the art, best metric is understood to mean the sequence reaching the best, hence the highest probability in the sense of the MAP criterion, which is equivalent to the best, hence the lowest minimal distance in the sense of the metric m(i) defined above.

An approximation is performed because this final best state Sf is considered as having the best metric within all the possible states which determine all the possible decoded codeword sequences, although it is taken only among the saved states. Hence, the method according to the invention is called an approximate method.

Finally, in a third step 3), the decoding is effected by going backward from the selected final best state Sf onto the path of the corresponding sequence in the state diagram, in order to recover the values of the symbols SY which have been sent through the sent sequence SQs.

Performances of the first and second embodiments of the method according to the invention are shown hereinafter. Performance Comparison with other Source Decoding Methods.

FIG. 5 and FIG. 6 show performances of the method according to the invention compared to other methods for source decoding of variable-length codeword sequences. The following method performances are illustrated:
  hard VLC decoding "HARD" (in circles),
  optimal soft VLC decoding "OPTIMAL" (in squares),
  Park & Miller VLC decoding "P&M" (in triangles up), and
  first embodiment of the method decoding according to the invention "AMAP-1" (in crosses),
  second embodiment of the method decoding according to the invention "AMAP-2" (in triangles right).

The hard VLC method is a method usually applied on fixed-length codeword sequences.

The optimal method, as defined in the prior art, is a method with no state reduction and no approximation. The other methods are approximate methods.

In these two Figures, we can see in particular the performance of the embodiments of the method according to the invention which uses a "vertical" condition (as it keeps some states as a function of a group associated with a bit time), versus, the performance of the P&M method which uses a "horizontal" condition (as it keeps some states as a function of the value of a symbol SY).

Both graphs of FIG. 5 and FIG. 6 show the performance in terms of Packet Error Rate PER versus signal to noise ratio Eb/NO, a packet corresponding to a codeword sequence SQ. Note that, the computation of signal to noise ratio is well-known to those skilled in the art. In other words, we calculate a performance versus a cost. The performance shows if a codeword sequence has been well decoded, and the cost shows how much power (energy/noise) has been used to send the bits of a codeword sequence SQ. Then, depending on the error we accept to have and/or the power we want to use, we select the best solution. Those of the optimal method and those of the hard method bound all performances.

For the second embodiment, the number NBMAX=3 of states to keep is chosen to be equal or inferior to the one obtained for the P&M method, in order to keep a fair comparison with respect to the P&M method. Indeed, for the P & M method, at each bit time, there are K states kept, as it is the decoded codeword sequence which has the best metric for each set of states, which symbols have the same value $[C_1, \ldots, C_i, \ldots, C_K]$ that is kept.

For the first graph in FIG. 5, a code CA is considered for the four above-mentioned methods.
  the considered variable-length code size is K=3,
  its maximal length L_MAX=2,
  the alphabet of the code comprises the values $[C_1; C_2; C_3]$= [0;10;11], the associated symbol probabilities [$Pc_{1(0)}$, $Pc_{2(10)}$, $Pc_{3(11)}$] have been chosen to be equal to [0.5;0.25;0.25], and
the number of symbols sent NB_SY=100.

As it can be seen in this first graph, it appears that the two embodiments of the method according to the invention perform better than the P&M method. Their performances are closer to the optimal method performances than those of the P&M method.

For the second graph in FIG. 6, a code CB is considered for the four above-mentioned methods.
the considered variable-length code size is K=6,
its maximal length L_MAX=4,
the alphabet of the code comprises the values [$C_1;C_2;C_3;C_4;C_5;C_6$]=[0;100;101;110;1110;1111],
the associated symbol probabilities [$Pc_{1(0)}$; $Pc_{2(100)}$; $Pc_{3(101)}$; $Pc_{4(110)}$; $Pc_{5(1110)}$; $Pc_{6(1111)}$] have been chosen to be equal to [0.5;0.15;0.17;0.08;0.06;0.04], and
the number of symbols sent=100.

As it can be seen in this second graph, it also appears that the two embodiments of the method according to the invention perform better than the P&M method. Their performances are closer to the optimal method performances than those of the P&M method. The different embodiments of the method according to the invention appear to perform similarly.

In order to adequately select the best method, a study of the state diagram complexity for each of these methods but the hard method is given in FIG. 7 for the first code CA. A number of transitions NbT between the states S in the whole state diagram and the number NbS of states symbolizes a complexity. Arrows in a state diagram represent the transitions. Thus, the complexity is related to NbT*NbS. As the maximum length of the code is K (K being equal to 3 in the case of code CA), the number of transitions per state is K for all the methods. Hence, it can be seen that, in practice, the complexity is in fact related to the number of states NbS.

In FIG. 7, the X-axis represents the number of bit times and the Y-axis represents the number of states NbS per bit time. This constitutes a good evaluation of the overall method complexity since the number of transitions per state is the same for each method as mentioned before.

It appears that, while the optimal method and the AMAP-1 method show a complexity linear with the state diagram bit times, the P&M method and the AMAP-2 method are both independent of the state diagram bit times values.

Similar results can be obtained when considering the case of the second code CB.

In conclusion, it appears from the results presented in these Figures, that the overall best solution is the second embodiment of the invention, the AMAP-2 method, since it gives a better Packet Error Rate PER with lower state diagram complexity when compared to other existing approximate methods. The number NBMAX of states to save for the second embodiment is preferably taken in the interval between 4 and 10. For this interval, there is a good balance between the complexity, which increases while NBMAX increases, and the performance, which does not improve anymore after the value NBMAX=10.

Implementation of the Method According to the Invention.

Here is one example of a soft implementation of the method according to the present invention.

In practice, the method according to the invention involves, in a first step, a first forward propagation with a metric computation process, where pointers to previous states are saved, and in a second step a trace-back process to establish the best decoded codeword sequence corresponding to one state selected from all the saved states.

In the first embodiment of the method according to the invention, the first forward propagation keeps, at each bit time, only the states S which have the best metric among all the states of their group G which have the same number of symbols SY, as mentioned before.

The state diagram will be described with the help of the following structures. One called "state", which comprises:
the number of symbols up to a considered state (which is compared with the number of symbols of the sent sequence for the final decision),
the number of bits up to the considered state (which corresponds to the number of bit time step),
the value of the symbol on the transition leading to the considered state (saved for the trace-back process),
the cumulative metric up to the transition leading to the considered state,
a first pointer PSTATE_PREV to the previous state,
a second pointer PSTATE_VERT_NEXT to the next "vertical" state to be investigated.

One called "trellis", which comprises:
a vector of integers storing the number of surviving states for each bit time, a matrix of the diagram states.

Note that the two pointers in the state structure are crucial for the method according to the invention. The first one PSTATE_PREV is necessary for the trace-back operation, and the second one PSTATE_VERT_NEXT allows the scanning of the "vertical" states, i.e. all the states for the same bit time Bj. An example is given in FIG. 8 to illustrate this.

Thus, the forward process for the first embodiment is effected as follows. At a bit time Bj, from a state S1j:
For each new investigated SI(j+1) state possibility:
If a state SE(j+1) already exists in the graph with the same bit time and the same number of symbols, THEN
compare the partial cumulative metrics between this existing state SE(j+1) and the investigated one SI(j+1). Keep the one with the best metric.
Else create the state in the graph and copy the investigated state SI(j+1) in it.
Investigate the next "vertical" state S2j (following the ad hoc pointer PSTATE_VERT_NEXT) or, if there is no more "vertical" state (second pointer PSTATE_VERT_NEXT equal to NULL), proceed to the next bit time Bj+1.

In the second embodiment of the method according to the invention, the first forward propagation keeps, at each bit time, NBMAX states, which have the best, metric, as mentioned before.

The structures used are the same as for the first embodiment.

Thus, the forward process for the second embodiment is effected as follows.
At a bit time Bj, from a state S1j:
For each new investigated state SI(j+1) possibility:
If a state SE(j+1) already exists in the graph with the same bit time and the same number of symbols THEN
compare the partial cumulative metrics between this existing state SE(j+1) and the investigated one SI(j+1). Keep the one with the best metric.
Else
If the number of existing states at the next bit time Bj+1 is inferior to the number of states to save NBMAX, THEN
Create the state in the graph and copy the investigated state SI(j+1) in it.
Else
determine the existing state SE(j+1) with the worse partial cumulative metric, and
compare the investigated state SI(j+1) with this worse existing state SE(j+1). Keep the one with the best metric.

Investigate the next "vertical" state S2j (following the ad hoc second pointer PSTATE_VERT_NEXT) or, if there is no more "vertical" state (second pointer PSTATE_VERT_NEXT equal to NULL), proceed to the next bit time Bj+1.

The trace-back process for both embodiments is effected as follows.

Research the best state at L-SQs bits with matching NB_SY of symbols
  If no state with the right number of symbols is found
    No match found
  Else
    One match found
    Go back and note down the symbols on the corresponding transitions
    Reverse the order of symbols to get the decoded codeword sequence It is to be noted that the present invention is not limited to the aforementioned embodiments and variations and modifications are possible without departing from the spirit and scope of the invention as defined in the appended claims. In this respect, the following closing remarks are made.

It is to be noted that the present invention is not limited to the aforementioned video application. It can be used within any application using variable-length coding and can support the cost of said decoding (in terms of computational complexity and time delay, said time delay, in the method according to the invention, is dependent on the end of the reception of a whole sequence because of the trace-back process). Typically, this can be used for instance in video, audio or text compression.

It is to be noted that the method according to the present invention is not limited to the aforementioned implementation.

There are numerous ways of implementing functions of the method according to the invention by means of items of hardware or software, or both, provided that a single item of hardware or software can carry out several functions. It does not exclude the fact that an assembly of items of hardware or software or both carry out a function. For example, the reduction step can be combined with the selection of the final best state step, thus forming a single function without modifying the method of source decoding according to the invention.

Said hardware or software items can be implemented in several manners, such as by means of wired electronic circuits or by means of a suitable programmed integrated circuit, respectively. The integrated circuit can be contained in a computer or in a decoder. In the second case, the decoder comprises states reduction means adapted to make the reduction step 1) in accordance with the first or second criteria, and selection means adapted to make the selection step 2), as described previously, said means being hardware or software items as stated above.

The integrated circuit comprises a set of instructions. Thus, said set of instructions, which is contained, for example, in a computer programming memory or in a decoder memory, may cause the computer or the decoder to carry out the different steps of the source decoding method.

The set of instructions may be loaded into the programming memory by reading a data carrier such as, for example, a disk. A service provider may also make the set of instructions available via a communication network such as, for example, the Internet.

Any reference sign in the following claims should not be construed as limiting the claim. It will be obvious that the use of the verb "comprise" and its conjugations does not exclude the presence of any steps or elements other than those defined in any claim. The article "a" or "an" preceding an element or step does not exclude the presence of a plurality of such elements or steps.

What is claimed is:

1. A method of source decoding variable-length codeword sequences, said source decoding being based on an associated state diagram comprising a plurality of states and on a code, a state being a node in the diagram through which possible decoded codeword sequences may pass, comprising:
   reducing the states in the state diagram in such a way that, at a bit time, only a number of states in a group of states is saved based on a criterion derived from a partial metric computation and otherwise independently of an alphabet of said code, the group being associated with the bit time; wherein the criterion is such that the saved states have best metrics in the group of states.

2. A method as claimed in claim 1,
   wherein the criterion is such that only one state is saved among all the states of the group which have same number of symbols, in accordance with the best metrics.

3. A method as claimed in claim 1, further comprising:
   selecting one final best state, among the saved states, as being the state with a best metric, and
   determining a best decoded codeword sequence which has a same number of symbols as a sent codeword sequence.

4. A computer program product for a decoder, comprising a set of instructions, which, when loaded into said decoder, causes the decoder to carry out the method as claimed in claim 1.

5. A computer program product for a computer, comprising a set of instructions, which, when loaded into said computer, causes the computer to carry out the method as claimed in claim 1.

6. A decoder for source decoding variable-length codeword sequences, said source decoding being based on an associated state diagram comprising a plurality of states and on a code a state being anode in the diagram through which possible decoded codeword sequences may pass, comprising:
   state reduction means adapted to save, at a bit time, only a number of states in a group of states based on a criterion derived from a partial metric computation and otherwise independently of an alphabet of said code, the group being associated with the bit time;
   wherein the criterion is such that the saved states have best metrics in the group of states.

7. A decoder as claimed in claim 6, wherein the criterion is such that only one state is saved among all the states of a group which have a same number of symbols in accordance with the best metrics.

8. A decoder as claimed in claim 6, further comprising:
   selecting means adapted to select one final best state, among the saved states, as being the state with a best metric, and adapted to determine a best decoded codeword sequence which has a same number of symbols as a sent codeword sequence.

9. A computer program embodied on a computer readable medium and capable of being executed by a processor, the computer program comprising instructions for:
   receiving a codeword sequence comprising a plurality of symbols;
   reducing a number of states in a state diagram used to decode the codeword sequence, wherein remaining states in the state diagram are selected based on at least one partial metric that is independent of the symbols in the codeword sequence; and decoding the codeword sequence using the state diagram having the reduced number of states and a shared code.

10. The computer program of claim 9, wherein reducing the number of states comprises reducing the number of states associated with a particular bit time.

11. The computer program of claim 9, wherein reducing the number of states comprises selecting only one state associated with a particular bit time.

12. The computer program of claim 9, wherein the number of remaining states does not exceed a specified maximum number of states.

13. The computer program of claim 9, wherein decoding the codeword sequence comprises:

determining a best decoded codeword sequence having a same number of symbols as the received codeword sequence using the state diagram; and outputting the best decoded codeword sequence.

14. A method, comprising:

receiving a codeword sequence comprising a plurality of symbols;

reducing a number of states in a state diagram used to decode the codeword sequence, wherein remaining states in the state diagram are selected based on at least one partial metric that is independent of the symbols in the codeword sequence; and decoding the codeword sequence using the state diagram having the reduced number of states and a shared code.

15. The method of claim 14, wherein reducing the number of states comprises reducing the number of states associated with a particular bit time.

16. The method of claim 14, wherein reducing the number of states comprises selecting only one state associated with a particular bit time.

17. The method of claim 14, wherein the number of remaining states does not exceed a specified maximum number of states.

18. The method of claim 14, wherein decoding the codeword sequence comprises:

determining a best decoded codeword sequence having a same number of symbols as the received codeword sequence using the state diagram; and outputting the best decoded codeword sequence.

19. A decoding system comprising a decoder, the decoder capable of:

receiving a codeword sequence comprising a plurality of symbols;

reducing a number of states in a state diagram used to decode the codeword sequence, wherein remaining states in the state diagram are selected based on at least one partial metric that is independent of the symbols in the codeword sequence; and decoding the codeword sequence using the state diagram having the reduced number of states and a shared code.

20. The decoding system of claim 19, wherein the decoder is capable of reducing the number of states by reducing the number of states associated with a particular bit time.

21. The decoding system of claim 19, wherein the number of remaining states does not exceed a specified maximum number of states.

* * * * *